United States Patent
Sanghani et al.

(10) Patent No.: US 8,522,190 B1
(45) Date of Patent: Aug. 27, 2013

(54) POWER DROOP REDUCTION VIA CLOCK-GATING FOR AT-SPEED SCAN TESTING

(75) Inventors: Amit Sanghani, San Jose, CA (US); Bo Yang, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/444,780

(22) Filed: Apr. 11, 2012

(51) Int. Cl.
G06F 11/22 (2006.01)
G06F 17/50 (2006.01)

(52) U.S. Cl.
USPC ........... 716/136; 716/103; 716/104; 716/106; 716/108; 716/109

(58) Field of Classification Search
USPC ................ 716/103, 104, 106, 108, 113, 109, 716/133
See application file for complete search history.

(56) References Cited

PUBLICATIONS

Bo Yang, Amit Sanghani, Shantanu Sarangi, and Chunsheng Liu, "A Clock-gating Based Capture Power Droop Reduction Methodology for At-Speed Scan Testing", Mar. 14, 2011.*
Krishna Chakravadhanula, Vivek Chickermane, Brion Keller, Patrick Gallagher and Prashant Narang, "Capture Power Reduction Using Clock Gating Aware Test Generation", Front-End Design Group, Cadence Design Systems, 2009.*

* cited by examiner

*Primary Examiner* — Nha Nguyen
*Assistant Examiner* — Brian Ngo
(74) *Attorney, Agent, or Firm* — Patterson & Sheridan, L.L.P.

(57) ABSTRACT

A clock gating mechanism controls power within an integrated circuit device. One or more clock gating circuits are configured to couple a system clock to a different portion of the integrated circuit device. A logic circuit applies an enabling signal to one of the clock gating circuits to control whether the system clock passes through the clock gating circuit to a portion of the integrated circuit device associated with the clock gating circuit. A plurality of scan flip-flops is configured to provide a binary code to the logic circuit, where the binary code indicates to the logic circuit that the enabling signal should be applied to the clock gating circuit. One advantage of the disclosed technique is that power droop during at-speed testing of a device is reduced without significantly increasing the quantity of test vectors or reducing test coverage, resulting in greater test yields and lower test times.

13 Claims, 7 Drawing Sheets

POWER DROOP REDUCTION VIA CLOCK-GATING FOR AT-SPEED SCAN TESTING

BACKGROUND OF THE INVENTION

1. Field of the Invention

The present invention generally relates to automated testing of integrated circuits and, more specifically, to power droop reduction via clock gating for at-speed scan testing.

2. Description of the Related Art

As transistor geometries decrease in size and integrated circuit device surface areas increase, the number of transistors per device increases dramatically. Automatic test pattern generation (ATPG) testing of such a device during the manufacturing process typically employs two phases. The first phase (referred to herein as the "scan-load phase") is used to initialize the device to a known state for a particular test cycle. During the scan-load phase, relatively few transistors are being switched, and the device enters a quiescent, low-leakage current phase of operation. The second phase (referred to herein as the "capture phase") sends one or more sets of clock pulses through the device to exercise the device at a rated speed. During the capture phase, a relatively large quantity of the device's transistors are being switched at a rated speed, and the device shifts into an active phase of operation, with a correspondingly high demand for current from the device's power grid.

A rapid shift from the scan-load (quiescent) phase to the capture (active) phase causes a sudden demand for a large amount of current from the power grid of the device. As a result, the power grid may temporarily experience an inductive reaction to the sudden demand for current. The inductive reaction, in turn, causes a power droop on the power grid of the device. Such a power droop may cause the device to fail the at-speed test or to operate at a slower speed during the test. Such a failure or reduction in operational speed, however, may amount to a false negative. In normal operation, an integrated circuit device typically does not experience a rapid shift from quiescent to active states, and does not experience the same power droop as is characteristic during automated testing. In other words, the failure of the device during at-speed testing does not mean the device fails to meet the requirements for normal operation.

One potential solution is to test the device at a lower speed. Testing at a lower speed allows the device allows the device to recover from the large current demand when transitioning from the scan-load phase to the capture phase, prior to clocking the device and capturing the test result. One problem with this approach is testing the device at a lower speed increases test times. Another potential solution is to switch fewer transistors at a time during automated testing. One problem with this approach is that a higher number of test vectors is required to test the device, which, in turn, increases device test times.

As the foregoing illustrates, what is needed in the art is a technique that reduces power droop during at-speed testing of devices, such as integrated circuits.

SUMMARY OF THE INVENTION

One embodiment of the present invention sets forth a computer-implemented method for designing a clock gating mechanism. The method includes receiving a first netlist associated with at least a portion of an integrated circuit device, where the netlist comprises a description of components within the portion of the integrated circuit device and the connections among the components. The method further includes generating a first model of the clock gating mechanism that is configured to limit current draw within the at least a portion of the integrated circuit device associated with the first netlist. The method further includes creating a second netlist by modifying the first netlist based on the first model; causing a first set of test vectors to be generated for the second netlist; and applying the first set of test vectors to the second netlist to determine whether the first model of the clock gating mechanism meets one or more performance metrics.

One embodiment of the present invention sets forth a clock gating mechanism for controlling power within an integrated circuit device. The clock gating mechanism includes a plurality of clock gating circuits, where each clock gating circuit is configured to couple a system clock to a different portion of the integrated circuit device. The clock gating mechanism further includes a first logic circuit configured to apply an enabling signal to a first clock gating circuit within the plurality of clock gating circuits to control whether the system clock passes through the first clock gating circuit to a first portion of the integrated circuit device associated with the first clock gating circuit. The clock gating mechanism further includes a plurality of scan flip-flops configured to provide binary code to the first logic circuit, wherein the binary code indicates to the first logic circuit that the enabling signal should be applied to the first clock gating circuit.

Other embodiments include, without limitation, a computer-readable medium that includes instructions that enable a processing unit to implement one or more aspects of the disclosed methods as well as a system configured to implement one or more aspects of the disclosed methods.

One advantage of the disclosed technique is that power droop during at-speed testing of a device is reduced without significantly increasing the quantity of ATPG test vectors, resulting in greater test yields and lower test times.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
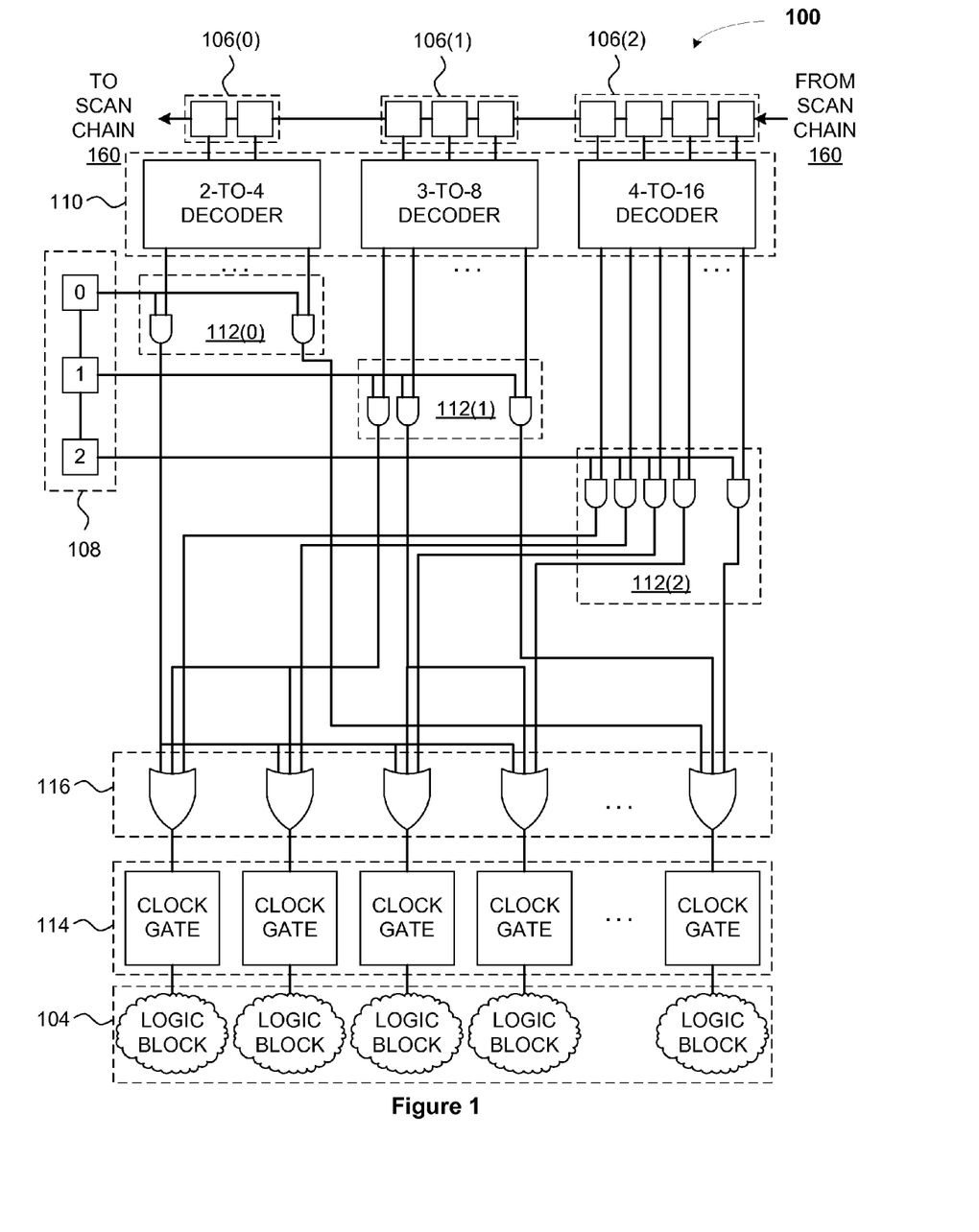
FIG. 1 illustrates a clock gating mechanism configured to control power in an integrated circuit device, according to one embodiment of the present invention.

FIG. 1 illustrates a clock gating mechanism 100 configured to control power in an integrated circuit device under test (DUT), according to one embodiment of the present invention. As shown, the clock gating mechanism 100 includes selector flip-flops 106, a decoder tree 110, level controls 112, control bits 108, OR gates 116, clock gates 114, and logic blocks 104.

The selector flip-flops 106 form binary input codes that select which decoder outputs in the decoder tree 110 are active. As shown, the selector flip-flops 106 are grouped to provide inputs for the multiple decoders in the decoder tree 110. Selector flip-flops 106(0), therefore, provide two inputs for the 2-to-4 decoder within decoder tree 110. Selector flip-flops 106(1) provide three inputs for the 3-to-8 decoder within decoder tree 110, and selector flip-flops 106(2) provide four inputs for the 4-to-16 decoder within decoder tree 110. The selector flip-flops 304 include scan flip-flops that operate in two distinct modes. The first mode occurs during the scan-load phase of automated testing. During the scan-load phase, the selector flip-flops are interconnected into a long shift-register or scan chain 160, where an output of one selector flip-flop is connected to an input of the next selector flip-flop 304(1). During this mode, an ATPG test vector may be serially scanned into the selector flip-flops 106 via the scan chain 160. The second mode occurs during the capture phase of automated testing, where the outputs of the selector flip-flops 106 are coupled to the inputs of the decoded in the decoder tree 110.

The decoder tree 110 includes multiple decoders having outputs that enable various clock gating groups. The decoder tree 110 includes a 2-to-4 decoder, a 3-to-8 decoder, and a 4-to-16 decoder to divide the clock gating groups 114 into four, eight, and sixteen groups, respectively. One output of each decoder is active at any given time based on the binary input pattern programmed into the enable flip-flops 106. The decoder outputs are combined via combinatorial logic to provide finer granularity and increased flexibility to control power during automated testing. The outputs from the decoder tree are connected to inputs of the AND gate included within the level controls 112.

The level controls 112 determine which of the outputs of the decoder tree 110 are enabled. The level controls 112 include AND gates where one input of each AND gate is connected to a decoder output included in the decoder tree 110. The other input of each AND gate is connected to one of the control bits 108. Level controls 112(0) determine whether the outputs of the 2-to-4 decoder are enabled, based on the state of control bit 0. Level controls 112(1) determine whether the outputs of the 3-to-8 decoder are enabled, based on the state of control bit 1. Level controls 112(2) determine whether the outputs of the 4-to-16 decoder are enabled, based on the state of control bit 2.

The control bits 108 form a binary code to determine which combination of decoder outputs is enabled at a given time. For example, if control bits[2:0] are set to 000, then none of the decoders would be enabled and all of the clock gating groups 114 would be disabled. If control bits[2:0] are set to 001, then the 2-to-4 decoder would be enabled, and the other two decoders would be disabled. If control bits[2:0] are set to 011, then the 2-to-4 decoder and the 3-to-8 decoder would be enabled, while the 4-to-16 decoder would be disabled, and so on. The control bits 108 are not part of the scan chain 160, but rather may be programmed and changed throughout a particular automated test. For example, the control bits 108 could be set as part of a test circuit compatible with the joint test action group (JTAG) standard.

The OR gates 116 conjunctively combine one or more outputs from the level controls 112 to form the enables for corresponding clock gating groups 114. Each of the OR gates 116 combines one output from each of the three decoders to form the enable for the respective clock gating group 114. The clock gating groups 114, in turn enable corresponding logic blocks 104 to be switched during a given portion of an automated test. The logic blocks 104 include combinatorial logic, flip-flops, memory devices, and other circuits configured to implement the various functional partitions within the DUT. In one embodiment, each logic block 104 includes substantially the same number of transistors, including combinatorial logic, flip-flops and other components. Therefore, each logic block 104 is configured to draw approximately the same amount of current from the power grid of the DUT.

The design of the clock gating mechanism 100 may be represented by a power level table. The following is an example of a power level table based on the clock gating mechanism 100:

| | Power Level | |
|---|---|---|
| Control bits | Minimum | Maximum |
| 000 | 0% | 0% |
| 001 | 25% | 25% |
| 010 | 12.5% | 12.5% |
| 011 | 25% | 37.5% |
| 100 | 6.25% | 6.25% |
| 101 | 25% | 31.25% |
| 110 | 12.5% | 18.75% |
| 111 | 25% | 43.75% |

The power level table may determine the number and type of decoders in the decoder tree 110 and the number of control bits 108. For example, the granularity of power level control could determine the type of at least one decoder within the decoder tree 110. A 2-to-4 decoder would divide the DUT into four portions, where each portion could consume approximately ¼ or 25% of the power of the DUT. A 3-to-8 decoder would divide the DUT into eight portions, where each portion could consume approximately ⅛ or 12.5% of the power of the DUT. A 4-to-16 decoder would divide the DUT into four portions, where each portion could consume approximately 1/16 or 6.25% of the power of the DUT. The maximum power level could determine the number of decoders within the decoder tree 110. For example, a decoder tree 110 with a 2-to-4 decoder, a 3-to-8 decoder, and a 4-to-16 decoder could enable up to 43.75% (25%+12.5%+6.25%) of the power of the DUT at a given time. The range of power levels may determine the number of control bits 108 and level controls 112 in the clock gating mechanism 100. A control bit pattern where multiple bits are high enables the outputs of multiple decoders in the decoder tree 110. For example, a control bit pattern with a binary code of 110 could enable the 3-to-8 decoder and the 4-to-16 decoder for a minimum power level of 12.5% and a maximum power level of 18.75%.

It should be recognized that the decoder tree 110 may include any combination and arrangement of decoders within the scope of the present invention. In addition, any number of control bits 108 may be included within the scope of the present invention. Further, any combinatorial logic as exemplified by the level controls 112 and the OR gates 116 may be included within the scope of the present invention. Further, the clock gating mechanism may be replicated for large designs such that a separate clock gating mechanism may be implemented for each partition, and an additional clock gating mechanism may be implemented for managing cross-domain signal testing. As such, the illustrations included in FIGS. 1-5 are to be considered exemplary and not limiting.

Figure 2:
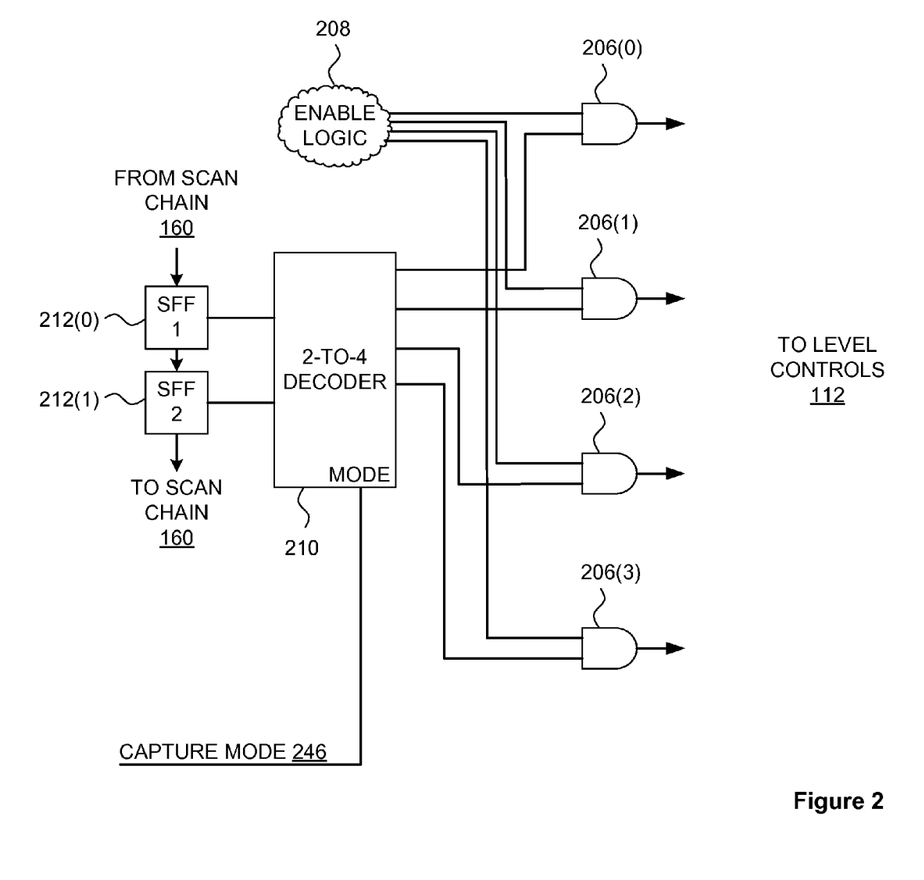
FIG. 2 illustrates a decoder tree of FIG. 1, according to one embodiment of the present invention.

FIG. 2 illustrates a decoder tree 110 of FIG. 1, according to one embodiment of the present invention. As shown, the decoder circuit 200 includes selector flip-flops 212, a decoder 210, low-power enable AND gates 206, and enable logic 208.

The selector flip-flops 212 form a 2-bit binary input code configured to select one of the outputs of the decoder 210 during automated testing. As described above, the selector flip-flops 212 are connected to the scan chain 160, such that the selector flip-flops are set according to an ATPG test vector. Accordingly, a particular test vector determines which of the four outputs of decoder 210 is active during a particular test, but a test vector does not enable more than output of the decoder 210 at any given time.

The decoder 210 provides enable outputs according to the value stored in the selector flip-flops 212. The decoder 210 operates in two modes, as determined by the capture mode input 246. Under the first mode, the capture mode input 246 is low, and the DUT is configured for normal operation. In this mode, all four outputs of the decoder 210 are high. Accordingly, the outputs of the decoder circuit 200 is determined by the enable logic 208. Under the second mode, the capture mode input 246 is high, and the DUT is configured for automated test operation. In this mode, one output of the decoder 210 is high while the other outputs are low.

As shown, the decoder 210 includes a 2-to-4 decoder that decodes a 2-bit binary input code, and enables one of the four outputs of the decoder 210 corresponding to the 2-bit binary input code. The decoder 210 provides one of the two inputs for each of the low-power enable AND gates 206.

The low-power enable (LPE) AND gates 206 provide the enable outputs of the decoder circuit 200. One input of the LPE AND gate 206 is driven by the decoder 210. The other input of the LPE AND gate 206 is driven by enable logic 208. The enable logic 208 provides the enable signals to the LPE AND gates 206 for the various partitions within the DUT. The enable logic 208 may include combinatorial logic and flip-flops. The enable logic 208 may be configured by an ATPG test vector to enable any or all partitions within the DUT. However, because the LPE AND gates 206 are also coupled to the outputs of the decoder 210, at most, only one LPE AND gate 206 provides an enable signal at any given time. The outputs of the LPE AND gates are coupled to the level controls 112 of FIG. 1.

For example, selector flip-flop 212(1) and selector flip-flop 212(0) could form a binary code notated as 212[1:0]. If the binary code 212[1:0] is set to 00, then the output of decoder 210 would enable LPE AND gate 206(0) and disable LPE AND gates 206(1), 206(2), 206(3). In such situations, LPE AND gate 206(0) would be enabled according to the state of enable logic 208, and the other three logic blocks 204(1), 204(2), 204(3) would be disabled and enter a low-power state. On the other hand, if the binary code 212[1:0] is set to 01, then the output of decoder 210 would enable LPE AND gate 206 (1) and disable the other three LPE AND gates 206(0), 206(2), 206(3). If the binary code 212[1:0] is set to 10, then the output of decoder 210 would enable LPE AND gate 206(2) and disable the other three LPE AND gates 206(0), 206(1), 206 (3). If the binary code 212[1:0] is set to 11, then the output of decoder 210 would enable LPE AND gate 206(3) and disable the other three LPE AND gates 206(0), 206(1), 206(2). Although the decoder circuit 200 has been described in the context of a 2-to-4 decoder 210, it should be recognized that the decoder circuit 200 may be implemented using any combination of one or more decoders within the scope of the present invention.

Figure 3:
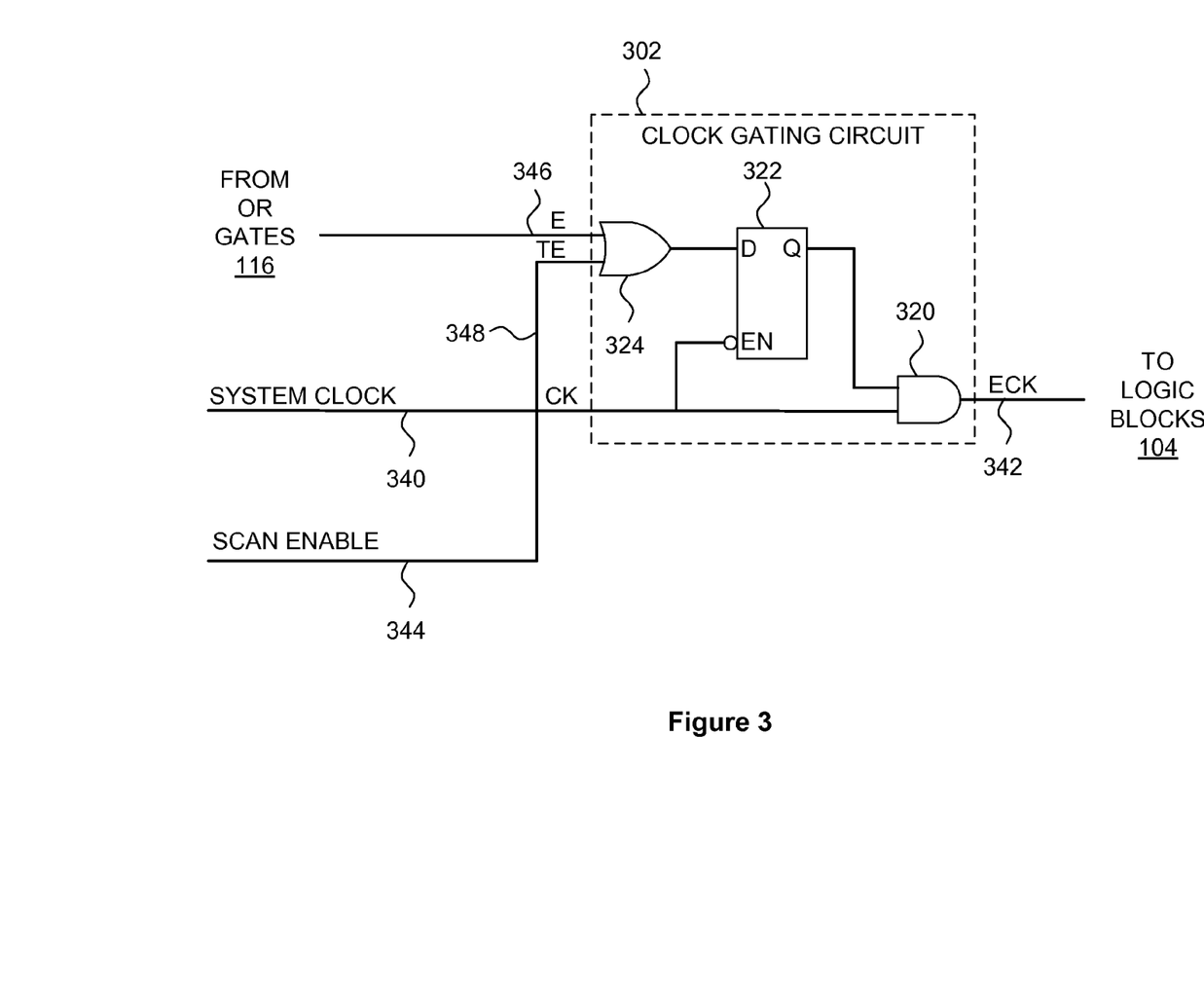
FIG. 3 illustrates a clock gate for a clock gating mechanism, according to one embodiment of the present invention.

FIG. 3 illustrates a clock gate 114 for a clock gating mechanism, according to one embodiment of the present invention. The clock gate 300 is configured to prevent the system clock 340 from passing through the circuit unless the system clock 340 is enabled via an enable input. As shown, the clock gate 300 includes an AND gate 320, a D latch 322, and an OR gate 324. The output of the AND gate 320 drives the enabled clock (ECK) signal 342. One input of the AND gate 320 is the system clock signal. The other input of the AND gate 320 is the Q output of the D latch 322. The AND gate passes the state of the system clock 340 passes to the ECK signal 342 whenever the Q output of the D latch 322 is high. The ECK signal 342 is held in the low state whenever the Q output of the D latch 322 is low. The D latch 322 passes the state of the D input to the Q output whenever the EN input is low, and holds the previous state of the Q output whenever the EN input is high. The D input of the D latch 322 is driven by the OR gate 324. The output of the OR gate is high if either the enable (E) input 346 is high or the test enable (TE) input 348 is high. Accordingly, the clock gate 300 enables the system clock 340 to drive the ECK output 342 whenever a high value is sensed on the E input 346, the TE input 348, or both. The logical OR of the E input 346 and the TE input 348 flows through the D latch 322 when the system clock is low and is latched by the D latch 322 when the system clock is high. The E input 346 is coupled one of the outputs of the OR gates 116 of FIG. 1. The ECK output 342 is coupled to one of the logic blocks 104 of FIG. 1.

Figure 4:
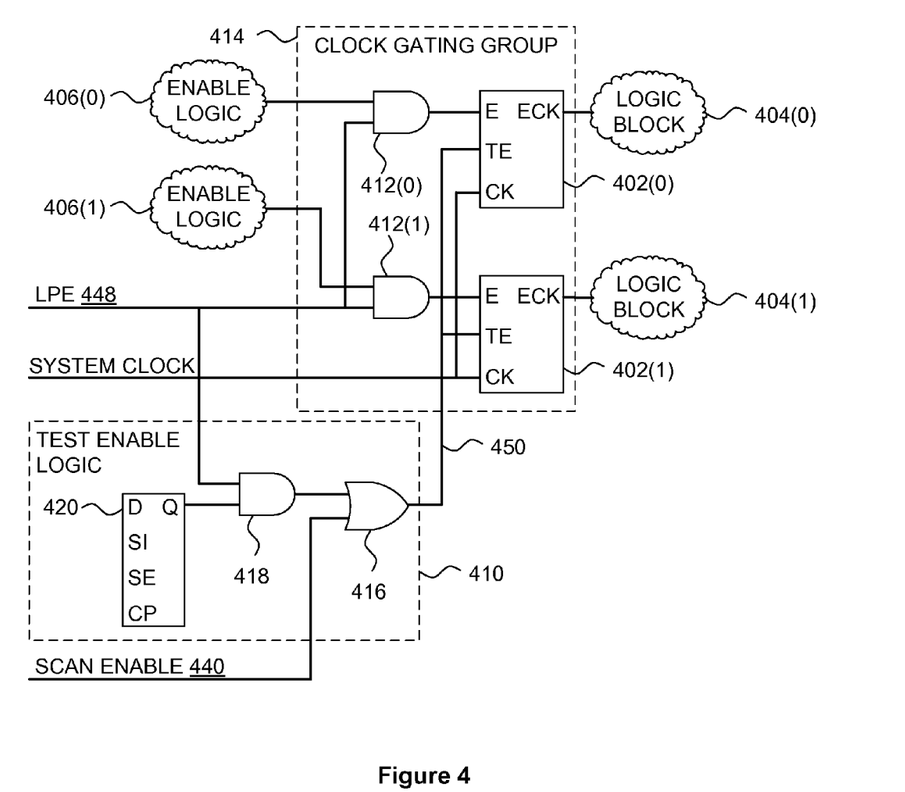
FIG. 4 illustrates a clock gate for a clock gating mechanism, according to another embodiment of the present invention.

FIG. 4 illustrates a clock gate 114 for a clock gating mechanism, according to another embodiment of the present invention. As shown, the clock gating mechanism 400 includes a clock gating group 414, enable logic 406, logic blocks 404, and test enable logic 410.

The clock gating group 414 includes multiple clock gating circuits, as exemplified by clock gating circuits 402(0), 402 (1), and multiple LPE AND gates, as exemplified by LPE AND gates 412(0), 412(1). As shown, LPE AND gates 412 (0), 412(1) are enabled by a single LPE input 448, where the LPE input 448 is received from one of the OR gates 116 of FIG. 1. The other input of LPE AND gates 412(0), 412(1) is controlled by separate enable logic 406(0), 406(1). For example, when the LPE input 448 is high, enable logic 406(0) would be configured to enable clock gating circuit 402(0), which, in turn, provides a system clock output for a corresponding logic block 404(0). When the LPE input 448 is high, enable logic 406(1) would be configured to enable clock gating circuit 402(1), which, in turn, provides a system clock output for a corresponding logic block 404(0). When the LPE input 448 is low, clock gating circuits 402(0), 402(1) would be disabled, and logic blocks 404(0), 404(1) would enter a low-power state.

Logic blocks 404 may be constrained in size corresponding to the current drive capability of the associated clock gating circuit 402. As such, large DUTs may include thousands of clock gating circuits 402. The clock gating mechanism 400 of FIG. 4 pools multiple clock gating circuits 402 into a single clock gating group 414, thereby providing for a simpler decoder design while balancing the current load for each clock gating circuit 402. In various embodiments, a clock gating group 414 may include any number clock gating circuits 402 and LPE AND gates 412.

In some embodiments, the test enable logic 410 provides an alternative mechanism to enable the clock gating group 414. When enable logic 406 is sufficiently complex, the ATPG software may have difficulty in generating test vectors to accurately control the enable inputs of the various clock gating groups 414. In such cases, the test enable logic 410 provides a mechanism to enable clock gating groups 414. As shown, the test enable logic 410 includes an OR gate 416, an AND gate 418 and a scan flip-flop 420. The OR gate 416 enables the clock gating group 414 via the TE input 450 under two conditions. The first condition occurs when the scan enable input 440 is high, as described above. The second condition occurs when the output of the AND gate 418 is high. The output of the AND gate 418 is high when both the LPE input 418 from the decoder is high and the output of the scan flip-flop 420 is high. The scan flip-flop is configured to be in the scan chain (not shown), and therefore may be set by an ATPG test vector during the scan-load phase of an automated test. For example, the ATPG software may generate a test vector that sets the Q output of the scan flip-flop 420 to 1. Then, when the LPE input 448 is also high, the output of the AND gate 418 is high. The output of OR gate 416, in turn, is high, enabling the TE input 450 of the clock gating group 414. The clock gating group 414 is thereby enabled whenever the LPE input 448 is high, regardless of the state of the enable logic 406(0) and 406(1).

The design of the clock gating mechanism for one or more partitions within the DUT may be modeled and analyzed in an automated fashion using a software application executing on a processing unit. The model is determined by one or more parameters, including, without limitation, the granularity of power level control, the maximum power level to be applied to the DUT, and the range of power levels to be applied to the DUT. For example, finer granularity of power level control could be achieved with a decoder that has more enable outputs, thereby dividing the DUT into smaller portions. A higher level of maximum power level could be achieved with a decoder that has fewer outputs, thereby dividing the DUT into larger portions. Alternatively, a higher level of maximum power level could be achieved by using multiple decoders provide separate enabling signals that could control different portions of the DUT. The range of power levels could be determined by the number of control bits 108. The control bits determine which decoders within the decoder tree 110 are active during a particular automated test and which decoders are inactive. As described below, a description of power level parameters, such as the power level table described in conjunction with FIG. 1, may provide input to a software application configured to determine the number and type of decoders in the decoder tree 110, the number of control bits 108, and the configuration of the OR gates 116 for a particular clock gating mechanism.

Figure 5A:
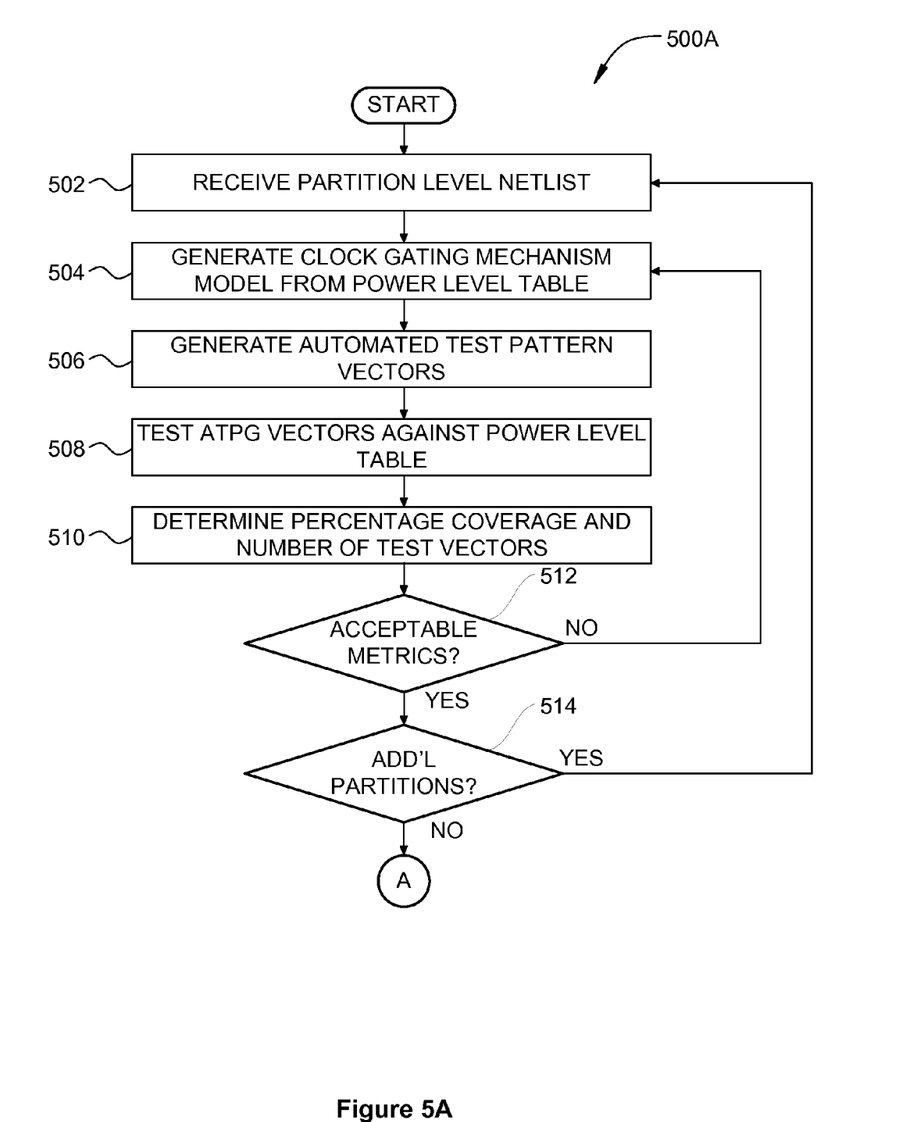
FIGS. 5A and 5B set forth a flow diagram of method steps for optimizing power control within a clock gating mechanism, according to one embodiment of the present invention.
Figure 5B:
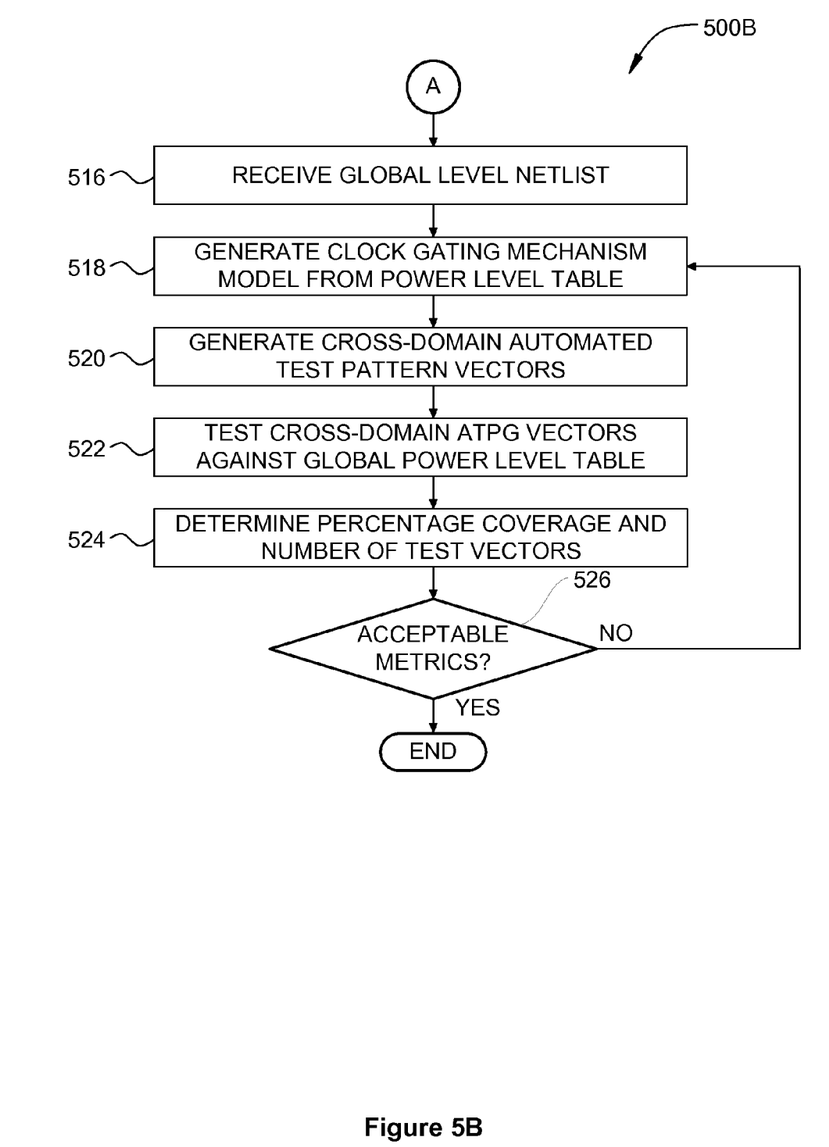

FIGS. 5A and 5B set forth a flow diagram 500A, 500B of method steps for optimizing power control within a clock gating mechanism, according to one embodiment of the present invention. Persons skilled in the art will understand that any computing system may include a processing unit configured to perform the method steps described herein. Such processing units may include, without limitation, one or more central processing units (CPUs), one or more multi-core CPUs, one or more parallel processing units (PPUs), one or more graphics processing units (GPUs), one or more special purpose processing units, or the like. Further, although the method steps are described in conjunction with a processor, persons skilled in the art will understand that any system configured to perform the method steps, in any order, is within the scope of the present invention.

The method begins at step 502, where a properly configured processor receives a netlist describing the circuit for a given partition or domain within the DUT. The netlist includes a description of components within the given partition or domain of the DUT and the connections among the components. At step 504, the processor generates the model of the clock gating mechanism according to the power level table for the partition. At step 506, the processor generates a set of automated test pattern vectors using the model of the clock gating mechanism as applied to the netlist for the partition. For example, the processor may invoke ATPG software using the partition netlist to generate test vectors for the partition. At step 508, the processor tests the generated ATPG test vectors against the clock gating mechanism design as determined by the power level table. At step 510, the processor determines the percentage test coverage and number of vectors for the design implementing the power level table. At step 512, the processor determines whether the test metrics are acceptable. For example, the processor may compare the test coverage and the number of test vectors for the design using the power level table versus the test coverage and the number of test vectors for the original design without the power level table. If the test metrics are not acceptable, then the processor returns to step 504, as described above. However, if the test metrics are acceptable, then the processor proceeds to step 514, where the processor determines whether there are additional partitions to analyze.

At step 514, if there are additional partitions to analyze, then the processor returns to step 502, as described above. However, if there are no additional partitions to analyze, then the processor proceeds to step 516, where the processor receives a global level netlist describing the circuit including cross-domain communication signals that connect between two or more partitions. At step 518, the processor generates the model of the clock gating mechanism according to the power level table for the global partition. At step 520, the processor generates a set of cross-domain automated test pattern vectors using the model of the clock gating mechanism as applied to the netlist for the global partition. For example, the processor may invoke ATPG software using the global netlist to generate test vectors for the global partition. At step 522, the processor tests the generated cross-domain ATPG test vectors against the clock gating mechanism design as determined by the global power level table. At step 524, the processor determines the percentage test coverage and number of vectors for the design implementing the global power level table.

At step 526, the processor determines whether the test metrics are acceptable. For example, the processor may compare the test coverage and the number of test vectors for the netlist with the model of the clock gating mechanism versus the test coverage and the number of test vectors for the netlist without the model of the clock gating mechanism.

If the test metrics are not acceptable, then the processor returns to step 518, as described above. However, if the test metrics are acceptable, then the method terminates.

It should be recognized that generating the global level power table may affect one or more of the partition level power tables. As such, the method set forth in FIGS. 5A and 5B may be performed multiple times to determine a power level table and associated clock gating mechanism that is optimized for the partition levels and for the global level.

Figure 6:
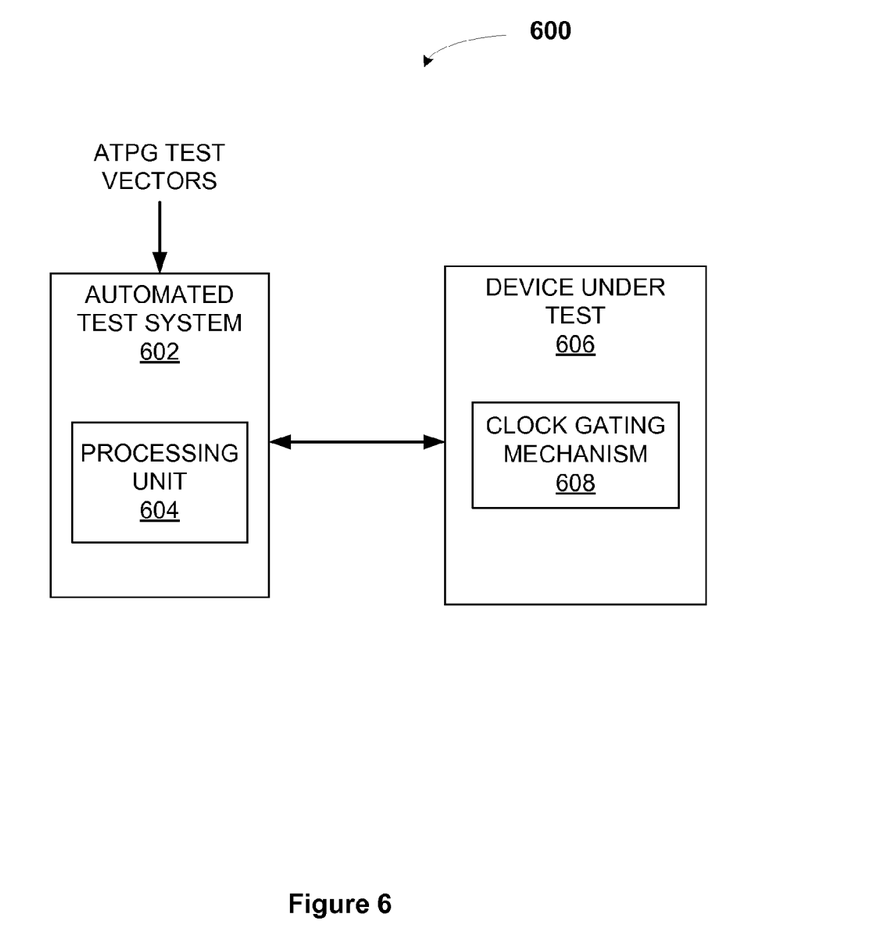
FIG. 6 illustrates a system configured to implement one or more aspects of the present invention.

FIG. 6 illustrates a system 600 configured to implement one or more aspects of the present invention. As shown, the system 600 includes an automated test system 602 and a device under test (DUT) 606.

The automated test system 602 is configured to perform one or more tests on the DUT 606. As shown, the automated test system 602 includes a processing unit 604. The processing unit 604 includes any computing system configured to perform the automated tests described herein, including, without limitation, one or more central processing units (CPUs), one or more multi-core CPUs, one or more parallel processing units (PPUs), one or more graphics processing units (GPUs), one or more special purpose processing units, or the like. The processing unit 604 is configured to execute instructions to perform one or more automated tests on at least a portion of the DUT 606. In some embodiments, the automated test system 602 is configured to simulate a test by applying the ATPG test vectors to a netlist corresponding to at least a portion of the DUT 606 rather than a physical DUT 606.

The DUT 606 is the physical device being tested by the automated test system 602. As shown, the DUT 606 includes a clock gating mechanism 608. The clock gating mechanism 608 is configured to enable or disable system clock signals to various portions of the DUT 606. The clock gating mechanism 608 is implemented using the techniques described herein as described in conjunction with FIGS. 1-4. The design of the clock gating mechanism 608 may be modeled and analyzed using the method steps as described in conjunction with FIGS. 5A-5B.

In sum, the disclosed technique provides deterministic power control within an integrated circuit device. A clock gating mechanism provides separate system clock signals to one or more portions of the integrated circuit device. The structure of the clock gating mechanism determines the maximum power level of the integrated circuit device during automated testing by limiting the number of partitions that may be simultaneously powered. The clock gating mechanism includes one or more decoders in a decoder tree to provide deterministic control over the maximum power level, the range of allowable power levels, and the granularity of power levels within the integrated circuit device during automated testing. In addition, the clock gating mechanism may include a second test enable input to assist ATPG software to generate enabling signals for each clock group, thus improving test coverage. The clock gating mechanism includes the ability to enable multiple portions of the device that may be connected to each other via one or more signal paths. In this way, cross-domain signal paths between multiple sections of the device may be tested. A model of the clock gating mechanism may be automatically generated based on one or more parameters. The model may be evaluated by determining whether the clock gating mechanism correctly manages power levels of the integrated circuit device while not substantially reducing test coverage or increasing the number of required test vectors.

Advantageously, power droop during at-speed testing of a device is reduced without significantly increasing the quantity of ATPG test vectors, resulting in greater test yields and lower test times. The disclosed techniques require no constraints to be placed on ATPG software in order to achieve power droop reduction. The additional circuitry requires little surface area on the device, and induces only a small amount of delay in the clock signal paths of the device. The additional circuitry produces deterministic power management during at-speed testing with little or no reduction in test coverage.

While the foregoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention. Therefore, the scope of the present invention is determined by the claims that follow.

What is claimed is:

1. A computer-implemented method for designing a clock gating mechanism, the method comprising:
receiving a first netlist associated with at least a portion of an integrated circuit device, wherein a netlist comprises a description of components within the at least a portion of the integrated circuit device and the connections among the components;
generating, with a processing unit, a first model of the clock gating mechanism that is configured to limit current draw within the at least a portion of the integrated circuit device associated with the first netlist;
creating a second netlist by modifying the first netlist based on the first model;
causing a first set of test vectors to be generated for the second netlist;
causing a second set of test vectors to be generated for the first netlist; and
applying the first set of test vectors to the second netlist to determine whether the first model of the clock gating mechanism meets one or more performance metrics;
wherein the one or more performance metrics includes at least one of a ratio of the number of test vectors included in the first set of test vectors to the number of test vectors included in the second set of test vectors and a ratio of the test coverage associated with the first set of test vectors to the test coverage associated with the second set of test vectors.

2. The method of claim 1, wherein if the first model of the clock gating mechanism does not meet the one or more performance metrics, further comprising:
generating a second model of the clock gating mechanism that is configured to limit current draw within the at least a portion of the integrated circuit device associated with the first netlist;
creating a third netlist by modifying the first netlist based on the second model;
causing a second set of test vectors to be generated for the third netlist; and
applying the second set of test vectors to the third netlist to determine whether the second model of the clock gating mechanism meets the one or more performance metrics.

3. The method of claim 1, wherein generating the first model comprises:
receiving one or more parameters that specify maximum power levels or power level ranges to be applied to the integrated circuit device; and
determining a configuration of the first model based on the one or more parameters.

4. The method of claim 3, wherein the configuration includes the number and types of one or more decoder circuits to implement in the clock gating mechanism.

5. The method of claim 3, further comprising receiving one or more parameters that specify a minimum difference between a first power level and a second power level to be applied to the integrated circuit device.

6. A non-transitory computer-readable storage medium including instructions that, when executed by a processing unit, cause the processing unit to perform an operation for designing a clock gating mechanism, the operation comprising:

receiving a first netlist associated with at least a portion of an integrated circuit device, wherein a netlist comprises a description of components within the at least a portion of the integrated circuit device and the connections among the components;

generating a first model of the clock gating mechanism that is configured to limit current draw within the at least a portion of the integrated circuit device associated with the first netlist;

creating a second netlist by modifying the first netlist based on the first model;

causing a first set of test vectors to be generated for the second netlist;

causing a second set of test vectors to be generated for the first netlist; and applying the first set of test vectors to the second netlist to determine whether the first model of the clock gating mechanism meets one or more performance metrics;

wherein the one or more performance metrics includes at least one of a ratio of the number of test vectors included in the first set of test vectors to the number of test vectors included in the second set of test vectors and a ratio of the test coverage associated with the first set of test vectors to the test coverage associated with the second set of test vectors.

7. The computer-readable storage medium of claim 6, wherein if the first model of the clock gating mechanism does not meet the one or more performance metrics, further comprising:

generating a second model of the clock gating mechanism that is configured to limit current draw within the at least a portion of the integrated circuit device associated with the first netlist;

creating a third netlist by modifying the first netlist based on the second model;

causing a second set of test vectors to be generated for the third netlist; and applying the second set of test vectors to the third netlist to determine whether the second model of the clock gating mechanism meets the one or more performance metrics.

8. The computer-readable storage medium of claim 6, wherein generating the first model comprises:

receiving one or more parameters that specify maximum power levels or power level ranges to be applied to the integrated circuit device; and determining a configuration of the first model based on the one or more parameters.

9. The computer-readable storage medium of claim 8, wherein the configuration includes the number and types of one or more decoder circuits to implement in the clock gating mechanism.

10. The computer-readable storage medium of claim 8, further comprising receiving one or more parameters that specify a minimum difference between a first power level and a second power level to be applied to the integrated circuit device.

11. A system comprising:

a processing unit configured to design a clock gating mechanism, by performing the steps of:

receiving a first netlist associated with at least a portion of an integrated circuit device, wherein a netlist comprises a description of components within the at least a portion of the integrated circuit device and the connections among the components;

generating a first model of the clock gating mechanism that is configured to limit current draw within the at least a portion of the integrated circuit device associated with the first netlist;

creating a second netlist by modifying the first netlist based on the first model;

causing a first set of test vectors to be generated for the second netlist;

causing a second set of test vectors to be generated for the first netlist; and applying the first set of test vectors to the second netlist to determine whether the first model of the clock gating mechanism meets one or more performance metrics;

wherein the one or more performance metrics includes at least one of a ratio of the number of test vectors included in the first set of test vectors to the number of test vectors included in the second set of test vectors and a ratio of the test coverage associated with the first set of test vectors to the test coverage associated with the second set of test vectors.

12. The system of claim 11, wherein if the first model of the clock gating mechanism does not meet the one or more performance metrics, further comprising:

generating a second model of the clock gating mechanism that is configured to limit current draw within the at least a portion of the integrated circuit device associated with the first netlist;

creating a third netlist by modifying the first netlist based on the second model;

causing a second set of test vectors to be generated for the third netlist; and applying the second set of test vectors to the third netlist to determine whether the second model of the clock gating mechanism meets the one or more performance metrics.

13. The system of claim 11, further comprising a memory coupled to the processing unit and including instructions that, when executed by the processing unit, cause the processing unit to perform the steps of receiving, generating, creating, causing, and applying.

* * * * *